United States Patent
Little et al.

(10) Patent No.: US 9,639,803 B1
(45) Date of Patent: *May 2, 2017

(54) COMPLEX CONFIGURATION PROCESSING USING CONFIGURATION SUB-MODELS

(71) Applicant: Versata Development Group, Inc., Austin, TX (US)

(72) Inventors: Nathan E. Little, Austin, TX (US); Brandon M. Beck, Austin, TX (US); Brian K. Showers, Cedar Park, TX (US)

(73) Assignee: Versata Development Group, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/551,580

(22) Filed: Nov. 24, 2014

Related U.S. Application Data (63) Continuation of application No. 12/969,071, filed on Dec. 15, 2010, now Pat. No. 9,020,880, which is a
(Continued)

(51) Int. Cl.
*G06F 17/00* (2006.01)
*G06N 5/04* (2006.01)

(52) U.S. Cl.
CPC .................................... *G06N 5/04* (2013.01)

(58) Field of Classification Search
CPC ......... G06F 17/50; G06F 17/00; G06Q 10/06; G06N 5/04; Y02T 10/82; G05B 19/4097;
(Continued)

(56) References Cited

U.S. PATENT DOCUMENTS 5,949,989 A * 9/1999 Falkowski ............. F01N 1/065
703/6
7,873,503 B2 1/2011 Loomans et al.
(Continued)

OTHER PUBLICATIONS

Non-Final Office Action dated Feb. 16, 2011, mailed in U.S. Appl. No. 12/969,071, pp. 1-39.
(Continued)

*Primary Examiner* — Stanley K Hill
*Assistant Examiner* — Peter Coughlan
(74) *Attorney, Agent, or Firm* — Terrile, Cannatti, Chambers & Holland, LLP; Kent B. Chambers (57) ABSTRACT

A configuration model dividing and configuration sub-model inference processing system and procedure addresses the issue of configuration model and query complexity by breaking a configuration problem down into a set of smaller problems, solving them individually and recombining the results into a single result that is equivalent to a conventional inference procedure. In one embodiment, a configuration model is divided into configuration sub-models that can respectively be processed using existing data processing resources. A sub-model inference procedure provides a way to scale queries to larger and more complicated configuration models. Thus, the configuration model dividing and configuration sub-model processing system and inference procedure allows processing by a data processing system of configuration models and queries whose collective complexity exceeds the complexity of otherwise unprocessable conventional, consolidated configuration models and queries.

39 Claims, 8 Drawing Sheets

Related U.S. Application Data continuation of application No. 10/957,919, filed on Oct. 4, 2004, now Pat. No. 7,882,057.

(58) Field of Classification Search
CPC .......... G05B 2219/35152; G05B 2219/35155; G05B 2219/35156
USPC .......................................................... 706/60
See application file for complete search history.

(56) References Cited

U.S. PATENT DOCUMENTS

| | | | |
|---|---|---|---|
| 7,882,057 B1 | 2/2011 | Little et al. | |
| 2003/0187950 A1 | 10/2003 | Rising, III | |
| 2004/0102890 A1* | 5/2004 | Brunell ................ | G05B 13/048 701/100 |
| 2004/0172150 A1* | 9/2004 | Perot .................. | A61C 13/0004 700/98 |

OTHER PUBLICATIONS

Response to Non-Final Office Action dated Feb. 16, 2011, as filed in U.S. Appl. No. 12/969,071 on Aug. 16, 2011, pp. 1-11.
Final Office Action dated Sep. 29, 2011, mailed in U.S. Appl. No. 12/969,071, pp. 1-45.
Request for Continued Examination (RCE) and RCE submission as filed in U.S. Appl. No. 12/969,071 on Mar. 29, 2012, pp. 1-15.
Non-Final Office Action dated Dec. 5, 2012, mailed in U.S. Appl. No. 12/969,071, pp. 1-37.
Response to Non-Final Office Action dated Dec. 5, 2012, as filed in U.S. Appl. No. 12/969,071 on Apr. 5, 2013, pp. 1-37.
Final Office Action dated May 9, 2013, mailed in U.S. Appl. No. 12/969,071, pp. 1-313.
Response to Final Office Action dated May 9, 2013, as filed in U.S. Appl. No. 12/969,071 on Sep. 9, 2013, pp. 1-14.
Request for Continued Examination (RCE) and RCE submission as filed in U.S. Appl. No. 12/969,071 on Oct. 9, 2013, pp. 1-18.
Non-Final Office Action dated Dec. 5, 2013, mailed in U.S. Appl. No. 12/969,071, pp. 1-36.
Response to Non-Final Office Action dated Dec. 5, 2013, as filed in U.S. Appl. No. 12/969,071 on May 5, 2014, pp. 1-12.
Terminal Disclaimer Review Decision for Approval dated May 7, 2014, mailed in U.S. Appl. No. 12/969,071, 1 page.
Notice of Allowance dated Sep. 5, 2014, mailed in U.S. Appl. No. 12/969,071, pp. 1-27.
Decision Denying Inter Partes Review mailed in Case IPR2016-01013 of U.S. Pat. No. 7,882,057 on Nov. 4, 2016, pp. 1-13.
Decision Denying Inter Partes Review mailed in Case IPR2016-01012 of U.S. Pat. No. 7,882,057 on Nov. 4, 2016, pp. 1-13.
Patent Owner Trilogy Development Group Inc.'s Preliminary Response as filed in Case IPR2016-01012 of U.S. Pat. No. 7,882,057 on Aug. 12, 2016, pp. 1-67.
Patent Owner Trilogy Development Group Inc.'s Preliminary Response as filed in Case IPR2016-01013 of U.S. Pat. No. 7,882,057 on Aug. 12, 2016, pp. 1-59.
Versata: About Us, http://cpq.versata.com/aboutus, Aug. 8, 2016, 1 page.
Ford Starts Firm to Manage Its Websites, Computerworld, Feb. 28, 2000, pp. 1-2, Computerworld, Inc., Online.
McCartney, Laton, Trilogy Making a Name for Itself, ZDNet, Jul. 28, 2000, pp. 1-11, Inter©ctive Week, http://www.zdnet.com/article/google-makes-preemptible-vms-more-efficient/ on Aug. 9, 2016.
Field, Tom, Suit Yourself, CIO, Apr. 15, 1997, pp. 1-2 and 108, vol. 10, Issue 13, International Data Group.
Plaintiff's Original Complaint for Damages and Injunctive Relief as filed in the United States District Court, Eastern District of Texas, Sherman Division, on May 7, 2015, regarding *Versata Development Group, Inc., F/K/A Trilogy Development Group, Inc., Versata Software, Inc., F/K/A Trilogy Development Group, Inc., and Trilogy, Inc.*, plaintiffs v. *Ford Motor Company*, defendant, pp. 1-32.
Versata Software, Inc. Company Report, May 18, 2016, pp. i, 1-3, and 10-12, Thomson Reuters, Online.
Ford and Trilogy Launch Web Company, InformationWeek Reports, Dec. 2014, 1 page, http://informationweek.com/fordandtrilogylaunchwebcompany/d/did/1008183 on Aug. 9, 2016, InformationWeek.
Transmittal of Exhibit 2011 as filed in Case IPR2016-01012 of U.S. Pat. No. 7,882,057 on Oct. 18, 2016, pp. 1-4.
The Patent and Trademark Appeal Board Record of Telephonic Conference on Oct. 11, 2016 as filed in Cases IPR2016-01012 and IPR2016-01013 of U.S. Pat. No. 7,882,057 on Oct. 18, 2016, pp. 1-44.
Petitioner's Power of dated May 5, 2016, as filed in Case IPR2016-01012 of U.S. Pat. No. 7,882,057 on May 9, 2016, pp. 1-3.
Jetition for Inter Partes Review as filed in Case IPR2016-01012 of U.S. Pat. No. 7,882,057 on May 9, 2016, pp. 1-82.
Notice of Filing Date Accorded to Petition and Time for Filing Patent Owner Preliminary Response mailed in Case PR2016-01012 of U.S. Pat. No. 7,882,057 on May 12, 2016, pp. 1-5.
Power of Attorney for Patent Owner dated May 27, 2016, for Case IPR2016-01019 of U.S. Pat. No. 7,464,064 as filed in IPR2016-01012 of U.S. Pat. No. 7,882,057 on May 27, 2016, pp. 1-2.
Versata Development Group, Inc.'s Mandatory Notices dated May 27, 2016, for Case IPR2016-01019 of U.S. Pat. No. 7,464,064 as filed in IPR2016-01012 of U.S. Pat. No. 7,882,057 on May 27, 2016, pp. 1-3.
Patent Owner's Power of Attorney Pursuant to 37 C.F.R. § 42.10(b) as filed in Case IPR2016-01012 of U.S. Pat. No. 7,882,057 on May 31, 2016, pp. 1-3.
Trilogy Development Group, Inc.'s Mandatory Notices as filed in Case IPR2016-01012 of U.S. Pat. No. 7,882,057 on May 27, 2016, pp. 1-3.
Patent Owner's Mandatory Notices Pursuant to 37 C.F.R. § 42.8(a)(2) as filed in Case IPR2016-01012 of U.S. Pat. No. 7,882,057 on May 31, 2016, pp. 1-7.
Declaration of Dr. Philip Greenspun in Support of Inter Partes Review as filed in Case IPR2016-01012 of U.S. Pat. No. 7,882,057 on May 9, 2016, pp. 1-174.
Resume of Philip Greenspun, May 4, 2016, http://philip.greenspun/personal/resume, as filed in Case IPR2016-01012 of U.S. Pat. No. 7,882,057 on May 9, 2016, pp. 1-4.
Stahl, Armin; Bergmann, Ralph; and Schmitt, Sascha; A Customization Approach for Structured Products in Electronic Shops; 13th International Bled Electronic Commerce Conference; Jun. 19-21, 2000 alleged; Bled, Slovenia; pp. 1-38.
Kott, Alexander; Agin, Gerald; and Fawcett, David; Abstract of Configuration Tree Solver: A Technology for Automated Design and Configuration; Extended Version appeared in the ASME Journal of Mechanical Design 114 (1):187-195, Mar. 1992; pp. 1-17.
Anselma, Luca; Magro, Diego; and Torasso, Pietro; Automatically Decomposing Configuration Problems; Dipartimento di Informatica, Universita di Torino; 2003; pp. 1-39; Springer-Verlag; Berlin.
Magro, Diego and Torasso, Pietro, Decomposing and Distributing Configuration Problems, Dipartimento di Informatica, Universita di Torino, 2002, pp. 1-10, Springer-Verlag; Berlin.
Bachant, Judith and McDermott, John, R1 Revisited:Four Years in the Trenches, Al Magazine, Fall 1984, pp. 21-32, vol. 5, No. 3, AAAI.
McDermott, John, R1: A Rule-Based Configurer of Computer Systems, Artificial Intelligence, 1982, pp. 39-72, vol. 19, North-Holland.
Kramer, Bryan M., Knowledge-based Configuration of Computer Systems Using Hierarchical Partial Choice, International Conference on Tools for Artificial Intelligence in SanJose, California, Nov. 1991, pp. 368-375, IEEE.
Yu, Bei and Skovgaard, Hans Jorgen, A Configuration Tool to Increase Product Competitiveness, IEEE, Jul.-Aug. 1998, pp. 34-41.
Wagner, Martin R., Understanding the ICAD System, 1990, pp. 1-167, ICAD, Inc., Cambridge, MA.

(56) References Cited

OTHER PUBLICATIONS

Damian, Stephen R., Oracle Configurator Developer User's Guide, 2002, pp. 1-330, Oracle Corporation, Redwood City, CA.
Schulz, Stefan, CBR-Works: A State-of-the-Art Shell for Case-Based Application Building, Proceedings of the 7th German Workshop on Case-Based Reasoning, GWCBR'99, Wrzburg, 1999, pp. 1-10, Springer-Verlag.
Stallman, Richard M. and Sussman, Gerald Jay, Forward Reasoning and Dependency-Directed Backtracking in a System for Computer-Aided Circuit Analysis, Massachusetts Institute of Technology Artificial Intelligence Laboratory, Memo No. 380, Sep. 1976, pp. 1-69.
McDaniel, George, IBM Dictionary of Computing, 1994, pp. 1-3 and 355, Tenth Edition, McGraw-Hill, Inc., NewYork, NewYork.
McCartney, Laton, Trilogy Making a Name for Itself, ZDNet, Jul. 28, 2000, pp. 1-4, http://www.zdnet.com/article/trilogy-making-a-name-for-itself/ on Aug. 12, 2016.
Transmittal of Exhibit 2011 as filed in Case IPR2016-01013 of U.S. Pat. No. 7,882,057 on Oct. 18, 2016, pp. 1-4.
Petitioner's Power of Attorney as filed in Case IPR2016-01013 of U.S. Pat. No. 7,882,057 on May 9, 2016, pp. 1-3.
Petition for Inter Partes Review as filed in Case IPR2016-01013 of U.S. Pat. No. 7,882,057 on May 9, 2016, pp. 1-80.
Notice of Filing Date Accorded to Petition and Time for Filing Patent Owner Preliminary Response mailed in Case PR2016-01013 of U.S. Pat. No. 7,882,057 on May 12, 2016, pp. 1-5.
Power of Attorney for Patent Owner as filed in Case IPR2016-01013 of U.S. Pat. No. 7,882,057 on May 27, 2016, pp. 1-2.
Trilogy Development Group, Inc.'s Mandatory Notices as filed in Case IPR2016-01013 of U.S Pat. No. 7,882,057 on May 27, 2016, pp. 1-3.
Patent Owner's Power of Attorney Pursuant to 37 C.F.C § 42.10(b) as filed in Case IPR2016-01013 of U.S. Pat. No. 7,882,057 on May 31, 2016, pp. 1-3.
Patent Owner's Mandatory Notices Pursuant to 37 C.F.R. § 42.8(a)(2) as filed in Case IPR2016-01013 of U.S. Pat. No. 7,882,057 on May 31, 2016, pp. 1-7.
Declaration of Dr. Philip Greenspun in Support of Inter Partes Review dated May 9, 2016, as filed in Case IPR2016-01013 of U.S. Pat. No. 7,882,057 on May 9, 2016, pp. 1-153.
Declaration of Dr. Sascha H. Schmitt dated Oct. 3, 2016 as filed in Case IPR2017-00150 of U.S. Pat. No. 7,882,057 on Oct. 28, 2016, pp. 1-22.
Petitioner's Power of Attorney dated May 5, 2016, as filed in Case IPR2017-00150 of U.S. Pat. No. 7,882,057 on Oct. 28, 2016, pp. 1-4.
Stahl, Armin; Bergmann, Ralph; and Schmitt, Sascha; A Customization Approach for Structured Products in Electronic Shops; 13th International Bled Electronic Commerce Conference; Jun. 19-21, 2000 alleged; Bled, Slovenia; pp. 252-264.
Declaration of Dr. Ralph Bergmann dated Oct. 14, 2016 as filed in Case IPR2017-00150 of U.S. Pat. No. 7,882,057 on Oct. 28, 2016, pp. 1-11.
Defendants' Answer to Plaintiffs Complaint, Affirmative and Special Defenses, Defendants' Counterclaims, and Reliance on Jury Demand as filed on Oct. 28, 2015 in *Ford Motor Company*, Plaintiff/Counter-Defendant v. *Versata Software, Inc., F/K/A Trilogy Software, Inc., Trilogy Development Group, Inc. and Trilogy, Inc.*, Defendants/Counter-Plaintiffs, United States District Court, Eastern District of Michigan, Case No. 15-10628-MFL-EAS (Consolidated with Case No. 15-11624-MFL-EAS), pp. 1-56.
Order to File Due Notice mailed in *Versata Development Group, Inc., F/K/A Trilogy Development Group, Inc., Versata Software, Inc., F/K/A Trilogy Development Group, Inc., and Trilogy, Inc., Plaintiffs* v. *Ford Motor Company*, Defendant Case No. 4:15-CV-00316 in the United States District Court for the Eastern District of Texas, Sherman Division, on Nov. 5, 2015, 1 p.
Order of Dismissal mailed in *Versata Development Group, Inc, F/K/A Trilogy Development Group, Inc., Versata Software, Inc., F/K/A Trilogy Development Group, Inc., and Trilogy, Inc.*, Plaintiffs v. *Ford Motor Company*, Defendant Case No. 4:15-CV-00316 in the United States District Court for the Eastern District of Texas, Sherman Division, on Dec. 3, 2015, 1 page.
Winston, Patrick Henry, Artificial Intelligence, May 1993, pp. 1-34, Addison-Wesley, Reading, Massachusetts.
Opinion and Order Denying Defendants' Motion to Dismiss, or Alternatively to Transfer This Action to the Eastern Districtof Texas (ECF #18) mailed in *Ford Motor Company*, Plaintiff, c. *Versata Software, Inc., et al.*, Defendants, Case No. 15-cv-10628 (consolitdated with Case No. 15-11624), United States District Court Eastern District of Michigan, Southern Division, on Oct. 14, 2015, pp. 1-19.
Versata's Notice Regarding Dismissal Without Prejudice, as filed in *Versata Development Group, Inc. F/K/A Trilogy Development Group, Inc., Versata Software, Inc., F/K/A Trilogy Development Group, Inc., and Trilogy, Inc.* v. Ford Motor Company, Case No. 4:15-CV-00316 in the United States District Court for the Eastern District of Texas, Sherman Division, on Nov. 30, 2015, pp. 1-3.
Complaint for Declaratory Judgment as filed on Mar. 16, 2015 in *Ford Motor Company, Plaintiffs,* v. *Versata Software, Inc., F/K/A Trilogy Software, Inc., Trilogy Development Group, Inc. and Trilogy, Inc.*, Defendants, in United States District Court, Eastern District of Michigan, Case No. 15-10628-MFL-EAS, pp. 1-23.
Petition for Inter Partes Review as tiled in Case IPR2017-00150 of U.S. Pat. No. 7,882,057 on Oct. 28, 2016, pp.1-83.
Declaration of Dr. Philip Greenspun in Support of Inter Partes Review as filed in Case IPR2017-00150 of U.S. Pat. No. 7,882,057 on Oct. 28, 2016, pp. 1-170.
Petitioner's Power of Attorney dated May 5, 2016, as filed in Case IPR2017-00151 of U.S. Pat. No. 7,882,057 on Oct. 28, 2016, pp. 1-4.
Petition for Inter Partes Review as filed in Case IPR2017-00151 of U.S. Pat. No. 7,882,057 on Oct. 28, 2016, pp. 1-88.
Notice of Filing Date Accorded to Petition and Time for Filing Patent Owner Preliminary Response mailed in Case IPR2017-00150 of U.S. Pat. No. 7,882,057 on Nov. 8, 2016, pp. 1-6.
Pfaffenberger, Bryan, Webster's New World Dictionary of Computer Terms, 1997, pp. 1-3 and 268, Sixth Edition, Simon & Schuster, Inc., NewYork, NewYork.
Microsoft Computer Dictionary, 2002, pp. 1-3 and 285, Fifth Edition, Microsoft Press, Redmond, Washington.
File History of U.S. Pat. No. 7,882,057, Oct. 4, 2004-Jan. 12, 2011, pp. 1-507.
Exhibit 3001 as filed in Case IPR2016-01013 of U.S. Pat. No. 7,882,057 on Nov. 4, 2016, 1 page.
Patent Owner Trilogy Development Group, Inc.'s Preliminary Response dated Feb. 8, 2017, as filed in Case PR2017-00150, U.S. Pat. No. 7,882,057, *Ford Motor Company*, Petitioner, v. *Trilogy Development Group, Inc.*, pp. 1-70.
Patent Owner Trilogy Development Group, Inc.'s Preliminary Response dated Feb. 8, 2017, as filed in Case PR2017-00151, U.S. Pat. No. 7,882,057, *Ford Motor Company*, Petitioner, v. *Trilogy Development Group, Inc.*, pp. 1-79.

\* cited by examiner

COMPLEX CONFIGURATION PROCESSING USING CONFIGURATION SUB-MODELS

BACKGROUND OF THE INVENTION

1. Field of the Invention

The present invention relates in general to the field of information processing, and more specifically to a system and method for processing complex configuration problems using configuration sub-models.

2. Description of the Related Art

Figure 1:
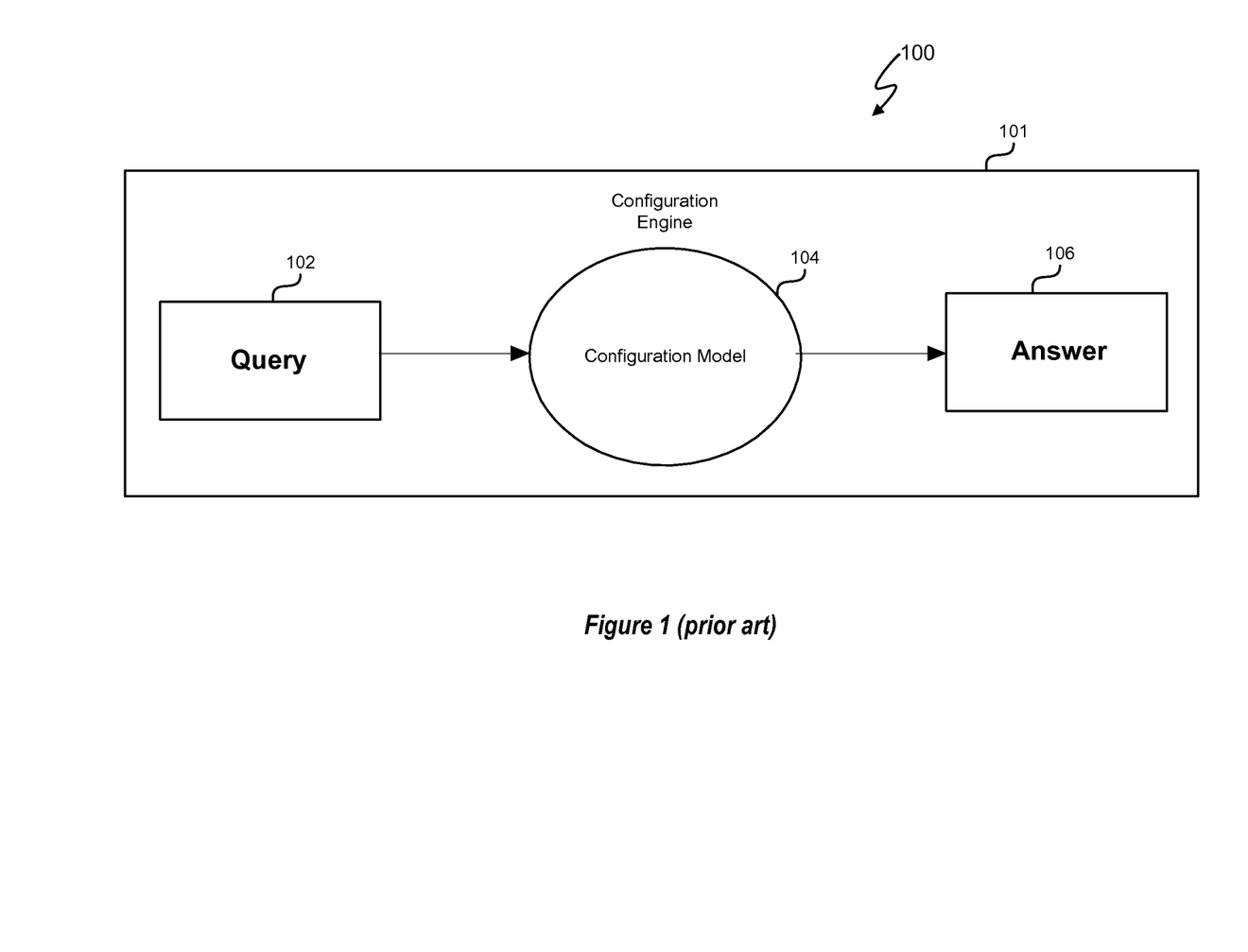
FIG. 1 (prior art) depicts a conventional product configuration process.

Computer assisted product configuration continues to offer substantial benefits to a wide range of users and industries. FIG. 1 depicts a conventional product configuration process 100 performed by a configuration engine 101. The configuration process 100 represents one embodiment of an inference procedure. In one embodiment of a conventional inference procedure, configuration query 102 is formulated based on user configuration input, a configuration engine performs the configuration query 102 using a configuration model 104, and the configuration engine provides an answer 106 to the configuration query 102 based on the configuration query 102 and the contents of the configuration model 104. The answer 106 represents a particular response to the configuration query 102.

A configuration model 104 uses, for example, data, rules, and/or constraints (collectively referred to as "data") to define compatibility relationships between parts (also commonly referred to as "features") contained in a specific type of product. A part represents a single component or attribute from a larger, more complex system. Parts may be combined in different ways in accordance with rules and/or constraints to define different instances of the more complex system. For example, "V6 engine" or the exterior color "red" can be parts on a vehicle, and a specific hard disk drive can be a part on a computer. A part group, also called a group, represents a collection of related parts. For example, an "Engines" group might contain the parts "V6 engine" and "4 cylinder engine". A product configuration is a set of parts that define a product. For example, a vehicle configuration containing the parts "V6 engine" and "red" represents a physical vehicle that has a red exterior and a V6 engine. A product can be a physical product such as a vehicle, computer, or any other product that consists of a number of configurable features such as an insurance product. Additionally, a product can also represent a service. A configuration query (also referred to as a "query") is essentially a question that is asked about the parts and relationships in a configuration model. The answer returned from a configuration query will depend on the data in the configuration model, the approach used for answering the question, and the specifics of the question itself. For example, one possible configuration query, translated to an English sentence, is the following: For the given configuration model, are the parts "red" and "V6 engine" compatible with each other.

The configuration model 104 can be used to determine, for example, which parts are compatible with other parts, and provide additional details around specific relationships. For example, a vehicle configuration model can indicate that "red" (a part) is the standard color feature for a specific vehicle, but that the color red is not compatible with "V6 engine" (a part). Configuration model 104 may also contain additional information needed to support specific product related queries. Configuration models can be developed in any number of ways. U.S. Pat. No. 5,825,651 entitled "Method and Apparatus for Maintaining and Configuring Systems", inventors Gupta et al., and assigned to Trilogy Development Group, Inc., describes an example configuration engine and rules based configuration model. U.S. Pat. No. 5,825,651 is incorporated herein by reference in its entirety. U.S. Pat. No. 5,515,524 entitled "Method and Apparatus for Configuring Systems", inventors John Lynch and David Franke, and assigned to Trilogy Development Group, Inc., describes another example configuration engine and constraint based configuration model. U.S. Pat. No. 5,515,524 is also incorporated by reference in it entirety.

Figure 2:
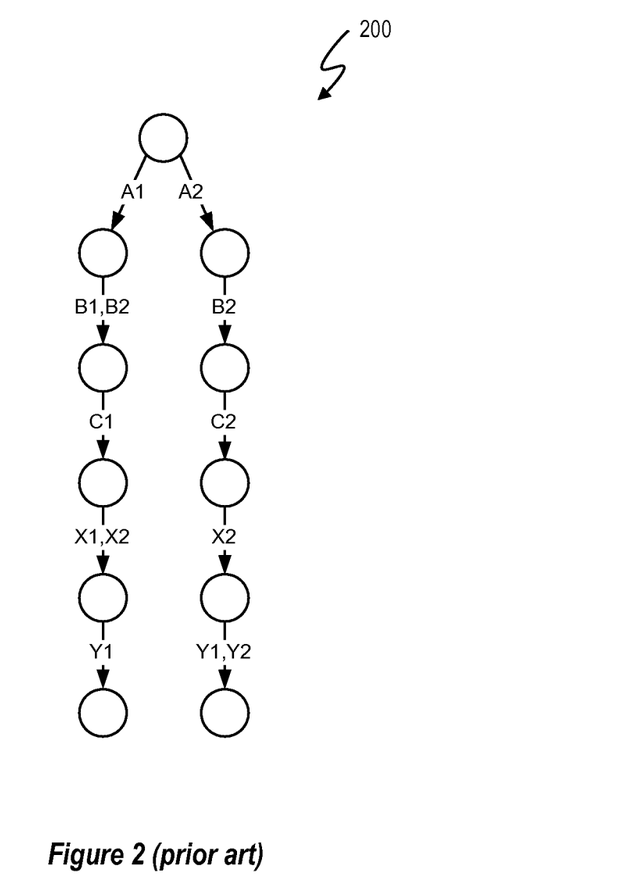
FIG. 2 (prior art) depicts a configuration model in graphical, tree based form.

FIG. 2 depicts an example configuration model 200 of a product represented in a graphical, tree based form. The product can be configured to include part combinations A1, B1 or B2, C1, X1 or X2, and Y1 or configured to include part combinations A2, B2, C2, X2, and Y1 or Y2. The configuration model 200 includes rules to define these part relationships. Table 1 represents an example rule set, wherein "S" represents "standard" and "O" represents optional. Configuration model 200 represents a relatively non-complex configuration model. Actual configuration models for a single product can include hundreds of thousands or more parts and rules.

TABLE 1

| Example Configuration Rules for a Product | | |
|---|---|---|
| A1 | S | ALL |
| A2 | O | ALL |
| B1 | S | A1 |
| B2 | S | A2 |
| B2 | O | A1 |
| C1 | S | A1 |
| C2 | S | A2 |
| X1 | S | C1 |
| X2 | S | C2 |
| X2 | O | C1 |
| Y1 | O | C1 |
| Y1 | S | C2 |
| Y2 | S | C1 |

Solving configuration problems using computer assisted technology often requires a significant amount of data processing capabilities. Consequently, configuration technologies have attempted to exploit increased data processing capabilities, memory capacities, and network data transfer throughput rates by increasing the capabilities of the configuration engines and/or enhancing the complexity of configuration models and configuration queries. The complexity of a configuration model can be defined in any number of ways, such as by the diversity of parts, part groups, rules, and constraints supported by the configuration model, by the number of parts, rules, and constraints, and by the complexity of part and part group relationships defined by configuration rules and constraints. In any event, the practical complexity achievable for configuration models has been limited by the ability of computer systems to process data within a given period of time, T, and/or limited by other processing constraints, such as a lack of memory. The time period, T, represents an amount of time considered reasonable to perform a configuration task. Time T can vary depending upon the application and expectation of configuration system users.

Figure 3:
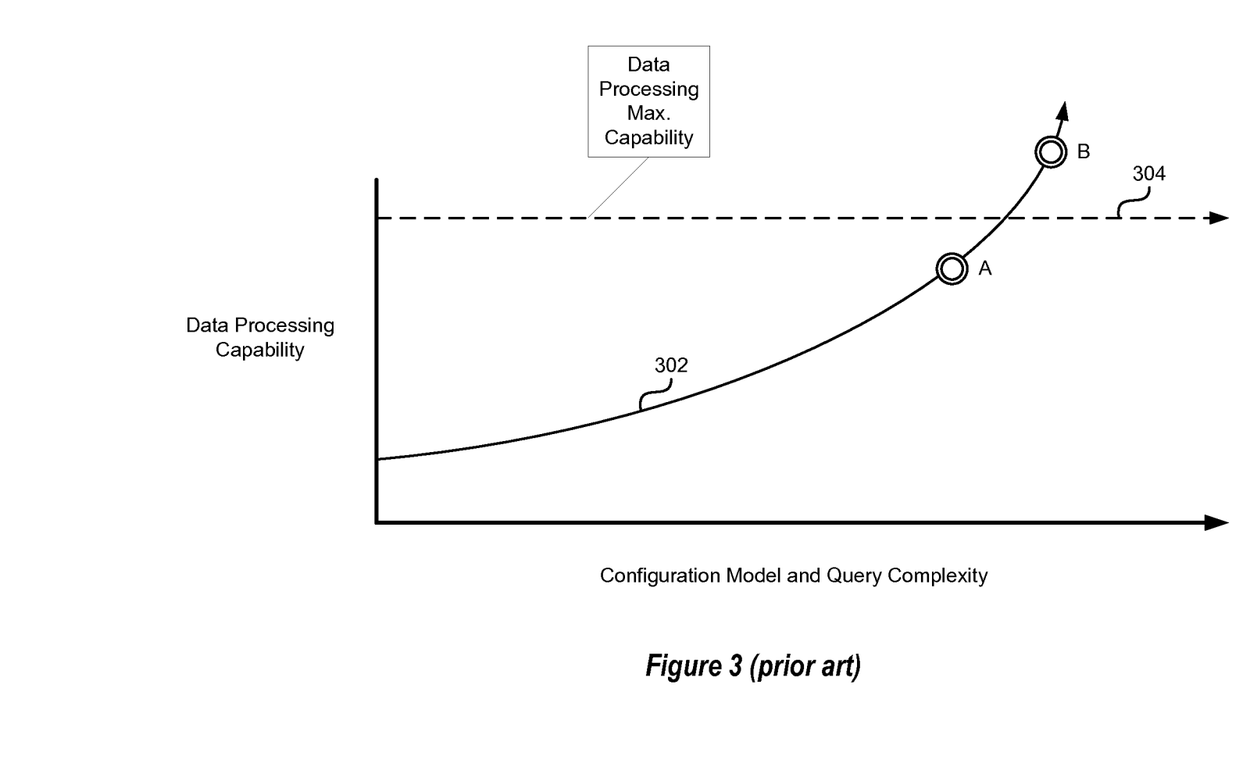
FIG. 3 (prior art) depicts a graph representing data processing capabilities of a computer system versus configuration model and query complexity.

FIG. 3 depicts a graph 300 representing the practical limitations of configuration model and configuration query complexity in terms of data processing capabilities. Graph 300 compares data processing capabilities of a particular computer system being used to configure a product versus configuration model and query complexity. Conventional inference procedures, such as configuration processes, have an exponential complexity associated with them as depicted by exponential performance curve 302. Sufficient data processing capability exists to process a configuration model and configuration query having the complexity represented by point A. The dashed line 304 represents the maximum data processing capability of the particular computer system being used. Thus, the computer system could not reasonably process configuration models and configuration queries having a complexity represented by point B.

SUMMARY OF THE INVENTION

In one embodiment, a sub-model inference procedure provides a way to scale queries to larger and more complicated configuration models. In one embodiment of the present invention, a method for using computer assisted configuration technology to solve product configuration problems using configuration sub-models includes processing one or more configuration queries using configuration sub-models, wherein the configuration sub-models collectively model a configurable product and generating an answer to the configuration problem based upon the processed one or more configuration queries and the configuration sub-models.

In another embodiment of the present invention, a computer system to implement an inference procedure for solving product configuration problems using configuration sub-models includes a processor and a storage medium having data encoded therein. The data includes processor executable code for processing one or more configuration queries using configuration sub-models, wherein the configuration sub-models collectively model a configurable product and generating an answer to the configuration problem based upon the processed one or more configuration queries and the configuration sub-models.

In another embodiment of the present invention, a computer storage medium comprising data embedded therein to cause a computer system to solve product configuration problems using configuration. The data includes code for processing one or more configuration queries using configuration sub-models, wherein the configuration sub-models collectively model a configurable product and generating an answer to the configuration problem based upon the processed one or more configuration queries and the configuration sub-models.

In another embodiment of the present invention, a computer system to implement an inference procedure for solving product configuration problems using configuration sub-models. The system includes means for processing one or more configuration queries using configuration sub-models, wherein the configuration sub-models collectively model a configurable product and means for generating an answer to the configuration problem based upon the processed one or more configuration queries and the configuration sub-models.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A configuration model dividing and configuration sub-model inference processing system and procedure addresses the issue of configuration model and query complexity by breaking a configuration problem down into a set of smaller problems, solving them individually and recombining the results into a single result that is equivalent to a conventional inference procedure. In one embodiment, a configuration model is divided into configuration sub-models that can respectively be processed using existing data processing resources. The sub-model inference procedure does not change the exponential nature of configuration model and query complexity but instead generates configuration sub-models on the side of the achievable performance curve. Accordingly, a sub-model inference procedure provides a way to scale queries to larger and more complicated configuration models. Embodiments of the configuration model dividing and configuration sub-model processing system and inference procedure allows processing by a data processing system of configuration models and queries whose collective complexity exceeds the complexity of otherwise unprocessable conventional, consolidated configuration models and queries.

Figure 4:
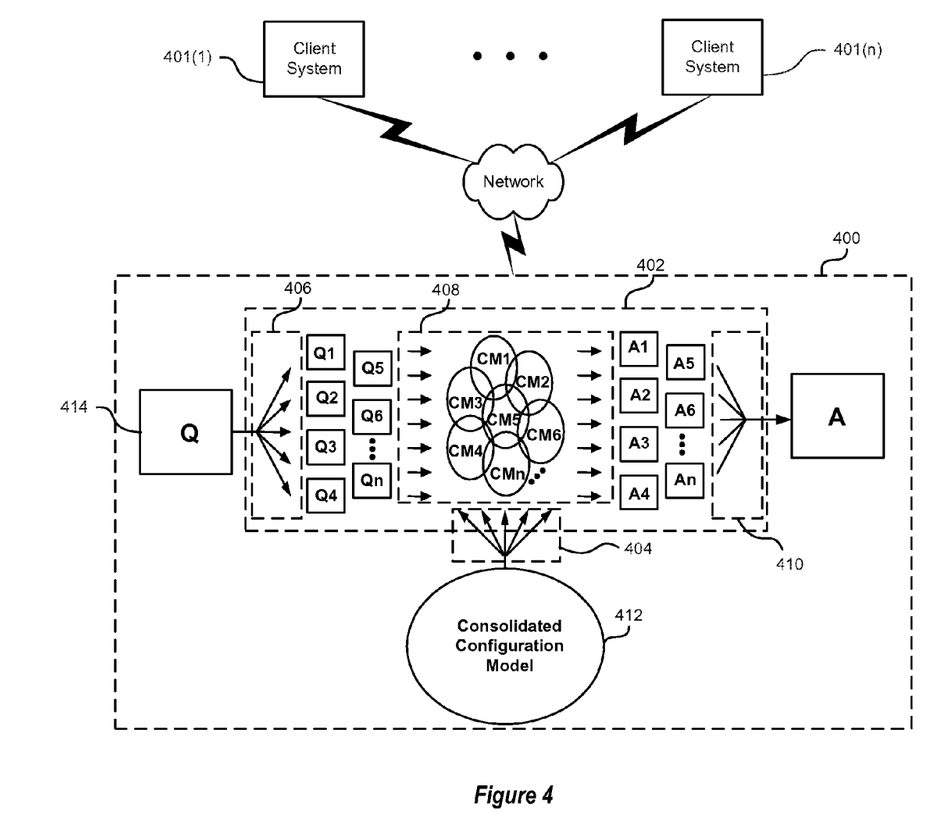
FIG. 4 depicts a configuration model dividing and configuration sub-model inference processing system that performs a configuration model dividing and configuration sub-model inference procedure.

FIG. 4 depicts the configuration model dividing and configuration sub-model inference processing system 400 (referred to herein as "sub-model processing system 400") that performs configuration model dividing and configuration sub-model inference procedure 402 (referred to herein as "sub-model inference procedure 402"). The sub-model inference procedure 402 includes operations 404, 406, 408, and 410. The sub-model processing system 400 can include software code that is executable by a processor of a computer system, such as a server computer system. In a network environment, the sub-model processing system 400 can be accessed by and communicates with any number client systems 401(1) through 401(n).

Operation 404 receives, as an input, a conventional, consolidated configuration model 412 and divides the consolidated configuration model 412 into a set of configuration sub-models CM1 through CMn, where n is an integer representing the number of configuration sub-models. The configuration sub-models are an input to this process. In one embodiment, the configuration sub-models meet the following criteria:

a. Each configuration sub-model should represent a portion of the source configuration model 412;

b. The data collectively contained in the configuration sub-models should be sufficient to provide an answer for each of the sub-queries Q1 through Qn or query being processed; and c. The configuration sub-models should be divided in such a way that the results of the sub-queries or query can be recombined to provide an answer to the input configuration query 414.

In another embodiment, a consolidated configuration model 412 is never actually created, and model developers develop only configuration sub-models to collectively model a configurable product.

Figure 5:
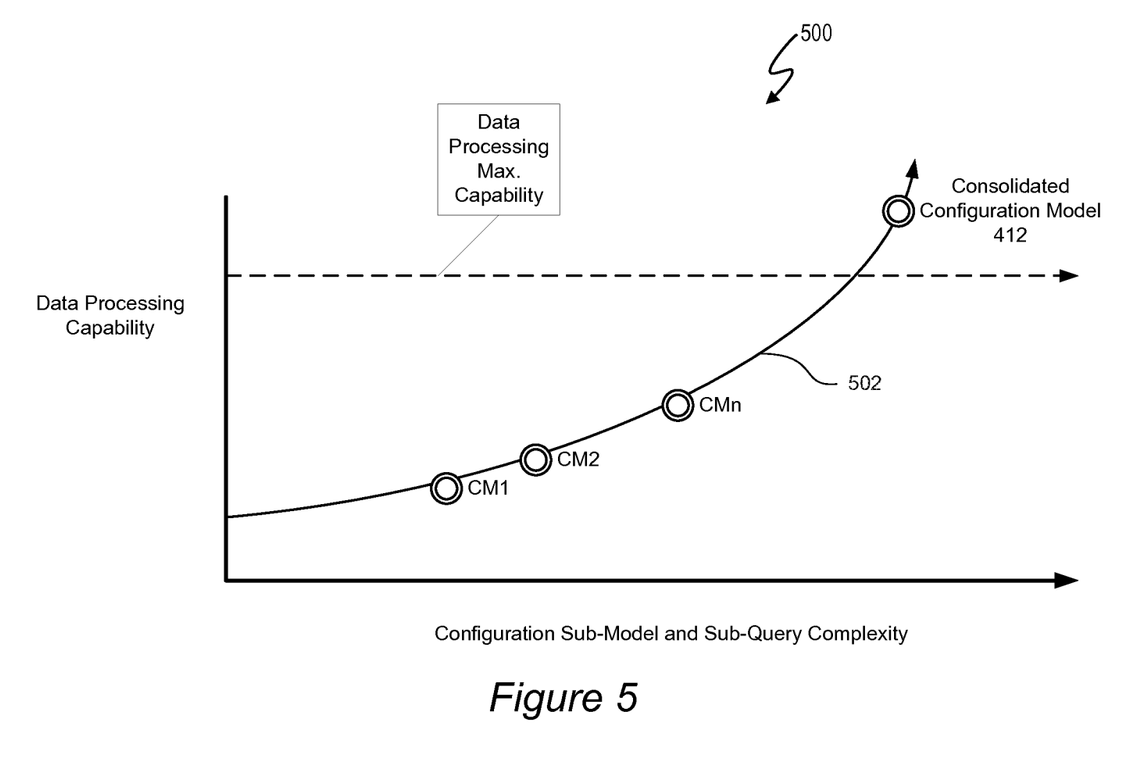
FIG. 5 depicts the data processing capability of a computer system being used to configure a product versus configuration sub-model and sub-query complexity.

FIG. 5 depicts the data processing capability of a computer system being used to configure a product versus configuration sub-model and sub-query complexity. In general, the consolidated configuration model 412 is divided sufficiently so that the complexity of each configuration sub-model CM1, CM2, through CMn is low enough to allow processing using available data processing capabilities while still representing the relationships included in the consolidated configuration model 412, which, in this embodiment, would otherwise not be cable of being processed by the computer system. Thus, the sub-model inference procedure 402 does not change the exponential nature of configuration model and query complexity but instead generates configuration sub-models on the side of the achievable performance curve. Accordingly, the sub-model inference procedure 402 provides a way to scale queries to larger and more complicated configuration models.

In one embodiment, operation 406 divides the conventional, consolidated configuration query 414 into a set of sub-queries Q1 through Qn, which together contain enough information to represent the original query 414. Each sub-query generated will be used to query against at least one configuration sub-model. A query is divided into enough sub-queries to perform a query on at least enough of the sub-models to produce an answer.

Whether to perform operation 406 and divide query 414 into sub-queries can depend upon the nature of the problem being solved. "Configuration completion" and "configuration validation" problems represent examples of two problems having different natures that result in different sub-query approaches. Configuration completion relates to determining whether a configuration is valid according to the Configuration Model. A configuration is considered complete if there is a part present from every required part group in the configuration model. For example, when performing configuration completion, dividing the query 414 into sub-queries allows the sub-queries to each be processed using at least one configuration sub-model. Configuration validation relates to determining whether a configuration is "valid" or "not valid" according to the configuration model. "Valid" indicates that the parts are all compatible with each other according to the part relationships in the configuration model, and "not valid" indicates that the parts are not compatible with each other. In performing configuration validation, dividing the query 414 into sub-queries is unnecessary to determine validation, because the query 414 can be applied in whole against configuration sub-models. If any answer generated by processing query 414 in accordance with a configuration sub-model results in an invalid (i.e. a non-configurable) answer, then the configuration is invalid. Otherwise, the configuration is valid.

In one embodiment, the following criteria are used by operation 406:

a. A single sub-query can be used to query against multiple sub-models. In other words, each sub-model does not have to have to process one and only one unique sub-query;

b. The query 414 can be processed as a sub-query;

c. When dividing a query into sub-queries, it is possible that there will be overlapping pieces of information contained in the sub-queries. It is not necessarily desired or a requirement that the sub-queries contain entirely independent questions;

d. The way the query is divided into sub-queries depends on the structure of the configuration sub-models. Specifically, it depends on the way the sub-models are related, and the relationships between the parts in the overall model. For example, assume the sub-models were originally generated by dividing up the model along family lines with some overlap. The sub-queries will generally (though are not required to) be divided up along similar family lines, with at least as many families present; and e. It will be understood by those of ordinary skill in the art that the way the query is divided into sub-queries also depends on the type of configuration query being performed. A configuration validation query might need a different Query Division approach than a Configuration Completion query.

Operation 408 processes the individual sub-queries Q1 through Qn against the configuration sub-models, producing a set of sub-answers. Enough sub-queries should be processed such that the sub-answers contain enough information to recombine them into a single answer to the input configuration query.

Operation 410 combines the sub-answers A1 through An together to create a single answer A. The answer A represents a correct answer for the input configuration query. However, for some queries, there are multiple correct answers. Thus, the answer determined by operation 410 is correct but may or may not be identical to an answer provided had the configuration query been performed using the conventional process depicted in FIG. 1. For example, in the case where the conventional process would return an "optimal" answer, the sub-model inference procedure 402 may return a sub-optimal, albeit correct, answer. Also, in the case that there is more than one "optimal" answer, the sub-model inference procedure 402 may return a different optimal answer than the conventional process.

In one embodiment, operations 404, 406, 408, and 410 are performed in order. However, operations 404, 406, 408, and 410 can be overlapping. For example, it is not required that any given operation finish completely before the next operation begins. For example, as each sub-query is processed in operation 408, the resulting sub-answer can be determined to generate a growing, cumulative answer A before the next sub-query is processed.

The following pseudo code represents the sub-model inference procedure 402:

```
result inference-procedure(model, query)
{
sub-models=divide-model(model) (Operation 404, implementation dependent on the specific problem) OR initially develop configuration sub-models
sub-queries=divide-query(query) (Operation 406, implementation dependent on the specific problem)
// This loop encompasses Operation 408 //
answers={ }
for(model in sub-models) {
    sub-query=find-sub-query(sub-queries, model)
```

```
// Get the right sub-query to be asking this sub-model
//
answer[model]=model.inference-procedure(sub-
    query)
// Run the inference procedure for this sub-query on the
    sub-model //
}
// Recombine the answers to each of the sub-queries into
    a single unified answer (Operation 410) //
result=combine(answers)
return result
}
```

The following examples illustrate embodiments of sub-model processing system 400 and sub-model inference procedure 402.

Example

Configuration Validation

The following example details sub-model inference procedure 402 in a context wherein an incoming configuration is complete (a part is present from every required part group). A query is generated using conventional processes to query against the configuration sub-models to determine if the configuration is valid.

The following pseudo code represents the embodiment of sub-model inference procedure 402 used for configuration validation:

```
//for the complete feature string validation problem
divide-model=procedure which breaks a consolidated
    model up into sub-models along family lines OR ini-
    tially develop configuration sub-models.
    divide-query=returns the original query unchanged
    combine=loop which takes each boolean answer and
        uses the logical AND operator to combine them
    into a single boolean answer //
boolean isBuildable(sub-models, query)
{
sub-queries=divide(query) (Operation 406);
    // Break the query into sub-queries. For a configuration
        validation query type, it is unnecessary to divide the
        query 414 into multiple sub-queries. Thus, in this
        embodiment of operation 406 query 414=sub-query
        Q1 and n=1. In other words, operation 406 can just
        return the entire original query 414 //
    answers=[ ] (operation 408)
    for(model in sub-models) {
        sub-query=find(sub-queries, model);
        // Get the right sub-query to be asking this sub-model
        //
        answers[model]=model.isBuildable(sub-query);
        // Query against each sub-model //
    }
    result=True
    for(answer in answers) // Operation 410 //{
        result=result && answer; // "&&" is a logical AND
            operator //
        // Recombine answers to sub-queries (this particular
            query type can just use a boolean and operator) //
    }
    return result;
}
```

Table 2 represents a conventional configuration model and query for a configuration validation problem:

TABLE 2

| Conventional Model: | | |
|---|---|---|
| A1 | S | ALL |
| A2 | O | ALL |
| B1 | S | A1 |
| B2 | S | A2 |
| B2 | O | A1 |
| X1 | S | ALL |
| X2 | O | ALL |

| Conventional Query: | |
|---|---|
| Are A1, B1 and X1 buildable together? | Yes |
| Are A2, B1 and X1 buildable together? | No |

The sub-model inference procedure 402 uses the conventional model as an input. In one embodiment, operation 404 divides the conventional model into the following configuration sub-models represented in Table 3, Table 4, and Table 5:

TABLE 3

| Family A model: | | |
|---|---|---|
| A1 | S | ALL |
| A2 | O | ALL |

TABLE 4

| Family B model: | | |
|---|---|---|
| B1 | S | A1 |
| B2 | O | A1 |
| B2 | S | A2 |

TABLE 5

| Family X model: | | |
|---|---|---|
| X1 | S | ALL |
| X2 | O | ALL |

Table 6 and Table 7 represent one embodiment of sub-queries generated by operation 406 and sub-answers generated by operation 408:

TABLE 6

| Sub-Queries Generated by Operation 406: | |
|---|---|
| 1. Is A1 buildable? | Yes |
| 2. Are A1 and B1 buildable together? | Yes |
| 3. Is X1 buildable? | Yes |

TABLE 7

| Sub-Queries Generated by Operation 406: | |
|---|---|
| 1. Is A1 buildable? | Yes |
| 2. Are A2 and B1, buildable together? | No |
| 3. Is X1 buildable? | Yes |

In operation 410, for this problem type, i.e. configuration validation problem, the sub-answers of the sub-queries can be AND-ed together and recombined into a single answer that is equivalent to the answer provided by querying the conventional configuration model.

Example

Configuration Completion

The configuration completion example below details an exemplary usage of the sub-model inference procedure 402 for a configuration completion query, in the specific case that the incoming configuration is incomplete (a part is not present from every required part group). The goal of a configuration completion query is to complete the partial configuration with parts from the missing part groups in such a way that the resulting configuration is valid according to the traditional configuration model and contains a single part from each part group.

To solve the incomplete feature string completion problem using configuration sub-models, the following process can be used:

divide-model=procedure which breaks a consolidated model up into sub-models in such a way that they are smaller than the original consolidated model and is sufficient to provide an answer for each sub-query being processed against it as previously described OR initially develop configuration sub-models;

divide-query=procedure which breaks the query up into n pieces where n is the number of sub-models (CM1, CM2, CMn);

Sub-query Qi has all of the parts from the original query that are from the part groups present in CMi; and combine=set intersection operator which takes the set of buildables returned from executing each sub-query Qi on the sub-model CMi and intersects them together to find common components. The returned set of buildables is complete and contains all parts that were on the original consolidated input query.

Figure 6:
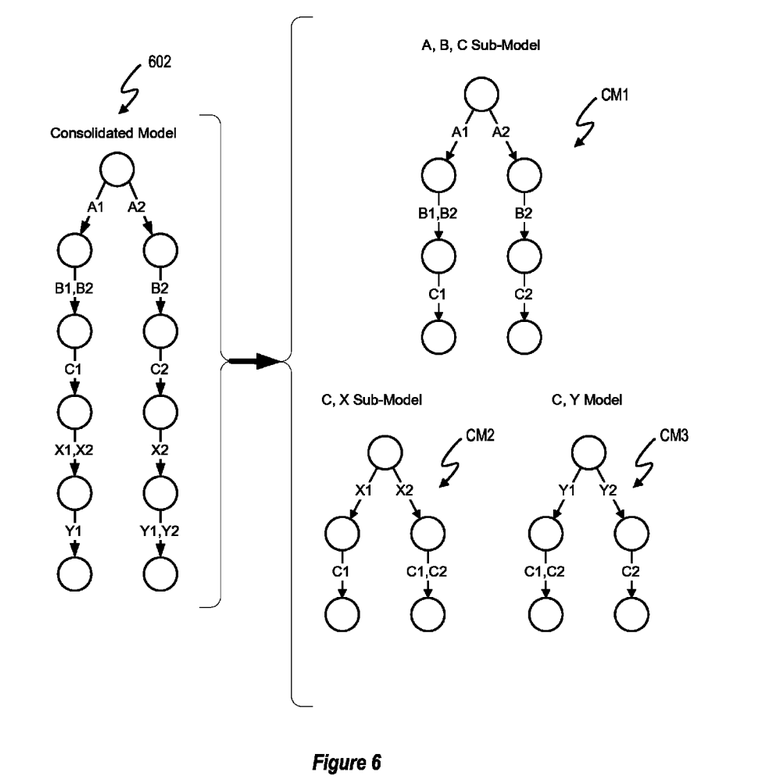
FIG. 6 depicts the division of a consolidated configuration model into configuration sub-models.

FIG. 6 depicts the division of consolidated configuration model 602 into configuration sub-models CM1, CM2, and CM3 in accordance with operation 404.

In one embodiment, the consolidated model 602 includes the rules contained in Table 8:

TABLE 8

Consolidated Model 602 Rules:

| | | |
|---|---|---|
| A1 | S | ALL |
| A2 | O | ALL |
| B1 | S | A1 |
| B2 | S | A2 |
| B2 | O | A1 |
| C1 | S | A1 |
| C2 | S | A2 |
| X1 | S | C1 |
| X2 | S | C2 |
| X2 | O | C1 |
| Y1 | O | C1 |
| Y1 | S | C2 |
| Y2 | S | C2 |

A conventional configuration completion process follows:
1. Complete the partial configuration X1, A1.
   This results in and inference procedure being run on the conventional configuration model 602 which searches for at least one buildable product configuration found that contains both X1 and A1. There are two configurations present in the model that satisfy these constraints:
   A1, B1, C1, X1, Y1
   A1, B2, C1, X1, Y1

2. Either one of these product configurations may be returned because both satisfy the original query.

The sub-model inference procedure 402 solves the same configuration completion problem by performing operation 404 to divide configuration model 602 into sub-models CM1, CM2, and CM3.

Operation 406 generates the following sub-queries, and operation 408 processes the sub-queries in accordance with the designated configuration sub-model to generate sub-answers:

Sub-Queries:
1. What buildables are present involving A1 in the A, B, C model? (Note: X1 is ignored in this sub-query because the X part group is not present in the A, B, C sub-configuration model.) (Also, a "buildable" refers to a set of part or part group configurations that adhere to relationships contained in a configuration sub-model).
   A1, B1, C1
   A1, B2, C1
2. What buildables are present involving X1 in the C, X model?
   C1, X1
3. What buildables are present in the C, Y model? (Note: The original input query doesn't involve any of the part groups contained in the C, Y model, so the query results in asking for all buildables present in this sub-configuration model.)
   Y1, C1
   Y1, C2
   Y2, C2

Operation 410 combines the sub-answers to form a collective answer A. For this particular type of query, i.e. a configuration completion query, the combination operation 410 involves intersecting the resulting buildable spaces together into one space. Performing operation 410 results in the following buildables.
   A1, B1, C1, X1, Y1
   A1, B2, C1, X1, Y1,
which are the same buildables generated by the traditional completion query.

The following sets forth an example, non-exhaustive list configuration problems that can be solved using sub-model processing system 400 and sub-model inference procedure 402:

Configuration Validation—This query indicates whether a configuration is "valid" or "not valid" according to the configuration model. "Valid" indicates that the parts are all compatible with each other according to the part relationships in the configuration model, and "not valid" indicates that the parts are not compatible with each other.

Configuration Completion—This query adds parts to a configuration until it becomes a complete, fully specified configuration, according to some heuristic. Configuration Completion attempts to guarantee that the resulting configuration is valid according to the Configuration Model. A configuration is considered complete if there is a part present from every required part group in the configuration model.

Configuration Correction—This query corrects an invalid configuration in an automated fashion. If the set of parts in the configuration are incompatible, Configuration Correction will remove and add enough parts to make the configuration valid according to some heuristic. Configuration Correction guarantees that the resulting configuration is valid according to the configuration model.

Configuration Explanation—This query returns human-readable explanations as to why an invalid configuration is invalid. Configuration Explanation gives enough information to provide the user assistance in manually correcting a feature string when multiple valid corrections apply.

Attribute Tracing—This query returns context-specific information about each part in a configuration. For example, if part descriptions depend on the market in which the vehicle is ordered, attribute tracing can return the descriptions of all of the parts in the configuration given the presence of a market part on the configuration.

There are a number of different ways that configuration models can be represented. As a result, the specific technology that performs a configuration query can vary depending on the model used. The sub-model processing system 400 and sub-model inference procedure 402 are not specific to a single configuration model representation or configuration processing approach. More specifically, the particular data structure(s) used to represent queries, sub-queries, configuration models, configuration sub-models, sub-answers, and answers is a matter of design choice and depends upon, for example, configuration engine specifications, familiarity, etc. The particular data manipulation techniques used to perform operations 404, 406, 408, and 410 are also a matter of design choice and generally relate to the type of data structure used. In one embodiment, tries are used to represent the data and trie operations are used to manipulate the data. Example tries and trie operations are set forth in U.S. patent application Ser. No. 10/404,891, entitled "Configuration Model Consistency Checking Using Flexible Rule Space Subsets", inventor Shawn A. P. Smith, filing date Mar. 31, 2003, and assigned to Trilogy Development Group, Inc. U.S. patent application Ser. No. 10/404,891 is hereby incorporated by reference in its entirety.

Figure 7:
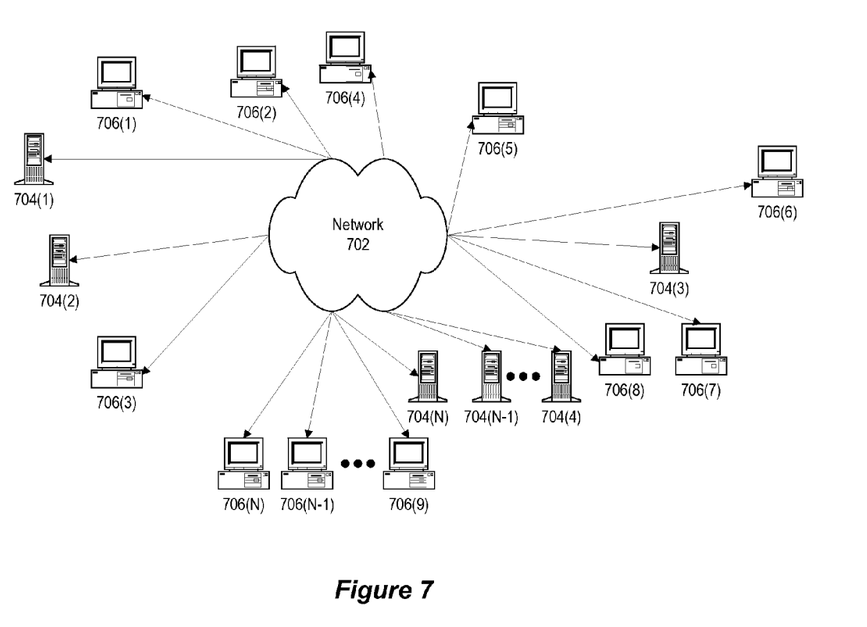
FIG. 7 depicts a block diagram illustrating a network environment in which the system and process of FIG. 4 may be practiced.

FIG. 7 is a block diagram illustrating a network environment in which a sub-model processing system 400 and sub-model inference procedure 402 may be practiced. Network 702 (e.g. a private wide area network (WAN) or the Internet) includes a number of networked server computer systems 704(1)-(N) that are accessible by client computer systems 706(1)-(N), where N is the number of server computer systems connected to the network. Communication between client computer systems 706(1)-(N) and server computer systems 704(1)-(N) typically occurs over a network, such as a public switched telephone network over asynchronous digital subscriber line (ADSL) telephone lines or high-bandwidth trunks, for example communications channels providing T1 or OC3 service. Client computer systems 706(1)-(N) typically access server computer systems 704(1)-(N) through a service provider, such as an internet service provider ("ISP") by executing application specific software, commonly referred to as a browser, on one of client computer systems 706(1)-(N).

Client computer systems 706(1)-(N) and/or server computer systems 704(1)-(N) may be, for example, computer systems of any appropriate design, including a mainframe, a mini-computer, a personal computer system including notebook computers, a wireless, mobile computing device (including personal digital assistants). These computer systems are typically information handling systems, which are designed to provide computing power to one or more users, either locally or remotely. Such a computer system may also include one or a plurality of input/output ("I/O") devices coupled to the system processor to perform specialized functions. Mass storage devices such as hard disks, compact disk ("CD") drives, digital versatile disk ("DVD") drives, and magneto-optical drives may also be provided, either as an integrated or peripheral device. One such example computer system is shown in detail in FIG. 8.

Figure 8:
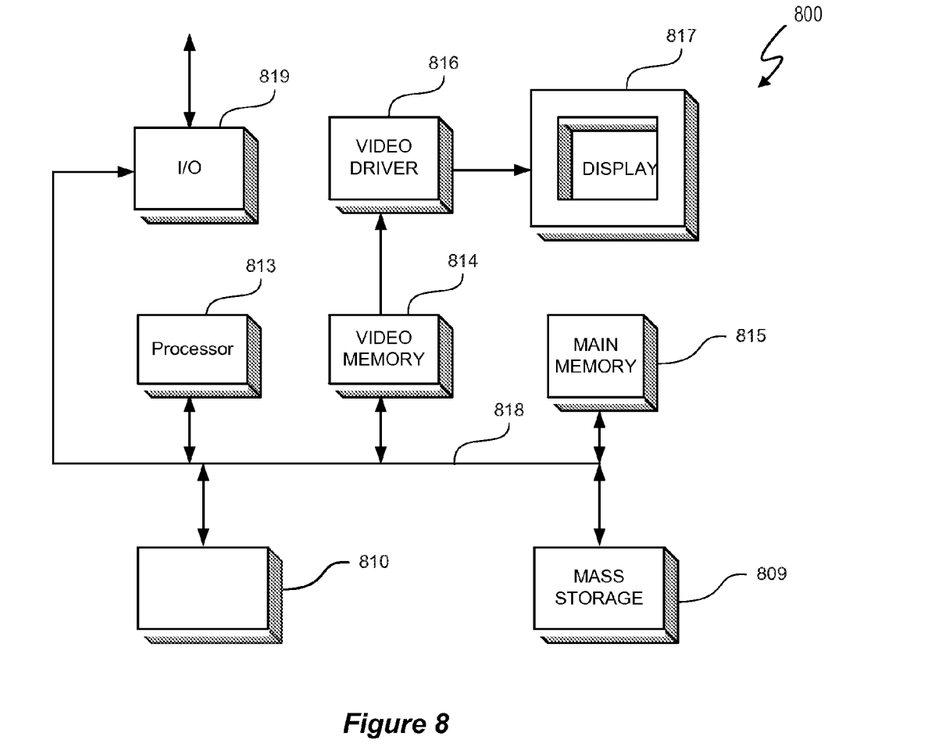
FIG. 8 depicts an example data processing system used in the network of FIG. 7.

Embodiments of the sub-model processing system 400 and sub-model inference procedure 402 can be implemented on a computer system such as a general-purpose computer 800 illustrated in FIG. 8. Input user device(s) 810, such as a keyboard and/or mouse, are coupled to a bi-directional system bus 818. The input user device(s) 810 are for introducing user input to the computer system and communicating that user input to processor 813. The computer system of FIG. 8 generally also includes a video memory 814, main memory 815 and mass storage 809, all coupled to bi-directional system bus 818 along with input user device(s) 810 and processor 813. The mass storage 809 may include both fixed and removable media, such as other available mass storage technology. Bus 818 may contain, for example, 32 address lines for addressing video memory 814 or main memory 815. The system bus 818 also includes, for example, an n-bit data bus for transferring DATA between and among the components, such as CPU 809, main memory 815, video memory 814 and mass storage 809, where "n" is, for example, 32 or 64. Alternatively, multiplex data/address lines may be used instead of separate data and address lines.

I/O device(s) 819 may provide connections to peripheral devices, such as a printer, and may also provide a direct connection to remote server computer systems via a telephone link or to the Internet via an ISP. I/O device(s) 819 may also include a network interface device to provide a direct connection to remote server computer systems via a direct network link to the Internet via a POP (point of presence). Such connection may be made using, for example, wireless techniques, including digital cellular telephone connection, Cellular Digital Packet Data (CDPD) connection, digital satellite data connection or the like. Examples of I/O devices include modems, sound and video devices, and specialized communication devices such as the aforementioned network interface.

Computer programs and data are generally stored as instructions and data in mass storage 809 until loaded into main memory 815 for execution. Computer programs may also be in the form of electronic signals modulated in accordance with the computer program and data communication technology when transferred via a network.

The processor 813, in one embodiment, is a microprocessor manufactured by Motorola Inc. of Illinois, Intel Corporation of California, or Advanced Micro Devices of California. However, any other suitable single or multiple microprocessors or microcomputers may be utilized. Main memory 815 is comprised of dynamic random access memory (DRAM). Video memory 814 is a dual-ported video random access memory. One port of the video memory 814 is coupled to video amplifier 816. The video amplifier 816 is used to drive the display 817. Video amplifier 816 is well known in the art and may be implemented by any suitable means. This circuitry converts pixel DATA stored in video memory 814 to a raster signal suitable for use by display 817. Display 817 is a type of monitor suitable for displaying graphic images.

The computer system described above is for purposes of example only. The sub-model processing system 400 and sub-model inference procedure 402 may be implemented in any type of computer system or programming or processing environment. It is contemplated that the sub-model processing system 400 and sub-model inference procedure 402 might be run on a stand-alone computer system, such as the one described above. The sub-model processing system 400 and sub-model inference procedure 402 might also be run from a server computer systems system that can be accessed by a plurality of client computer systems interconnected over an intranet network. Finally, the sub-model processing system 400 and sub-model inference procedure 402 may be run from a server computer system that is accessible to clients over the Internet.

Many embodiments of the present invention have application to a wide range of industries and products including the following: computer hardware and software manufacturing and sales, professional services, financial services, automotive sales and manufacturing, telecommunications sales and manufacturing, medical and pharmaceutical sales and manufacturing, and construction industries.

Although the present invention has been described in detail, it should be understood that various changes, substitutions and alterations can be made hereto without departing from the spirit and scope of the invention as defined by the appended claims.

What is claimed is:

1. A method for using computer assisted configuration technology to solve product configuration problems using configuration sub-models, the method comprising:
   performing with the computer assisted configuration technology;
   receiving one or more configuration queries from one or more computer systems;
   dividing one or more configuration queries into multiple configuration sub queries, wherein the one or more configuration queries represent one or more questions involving parts and part relationships in a configuration of a configurable product, the multiple configuration sub-queries represent the one or more configuration queries, and the parts represent a composition of matter of the configurable product;
   processing each sub-query using at least one configuration sub-model per sub-query, wherein the configuration sub-models collectively model a configurable product;
   generating a response to the one or more configuration queries based upon the processing of each sub-query using at least one configuration sub-model per sub-query; and
   providing the response to the one or more configuration queries as data for display by one or more display devices.

2. The method of claim 1 wherein each configuration sub-model includes data to define compatibility relationships between parts included in the configuration sub-model and each configuration sub-model (i) represents a portion of a configuration model of the configurable product and (ii) allows answers from each configuration sub-model to be combined to provide a consolidated answer to the one or more configuration queries.

3. The method of claim 1 wherein the one or more configuration queries relate to a configuration completion problem.

4. The method of claim 1 further comprising:
   processing each sub-query using multiple configuration sub-models per sub-query.

5. The method of claim 1 wherein the one or more configuration queries relate to a configuration validation problem and processing one or more configuration queries further comprises:
   processing at least one of the sub-queries using different configuration sub-models until a configuration validation answer can be determined.

6. The method of claim 1 wherein the data collectively included in the configuration sub-models provides a response for each of the sub-queries being processed.

7. The method of claim 1 wherein at least two sub-queries include overlapping information.

8. The method of claim 1 further comprising:
   dividing a consolidated configuration model into the multiple configuration sub-models in accordance with a predetermined data structure;
   wherein at least one of the configuration queries into multiple configuration sub-queries further comprises dividing the sub-queries in accordance with the sub-model structure.

9. The method of claim 8 wherein the predetermined data structure comprises a data structure divided along configuration model part groups, wherein the part groups are a collection of related parts.

10. The method of claim 1 wherein generating a response to the one or more configuration queries based upon the processed one or more configuration queries and the configuration sub-models further comprises:
    generating a response for each processed configuration sub-model; and
    combining each response for each processed configuration sub-model to generate the answer.

11. The method of claim 1 further comprising:
    dividing a consolidated configuration model into the configuration sub-models.

12. The method of claim 11 wherein dividing the consolidated configuration model into multiple configuration sub-models further comprises:
    dividing the configuration model so that complexity of each configuration sub-model allows processing using available data processing capabilities of the computer assisted configuration technology while still representing the relationships included in the consolidated configuration model.

13. The method of claim 11 wherein each configuration sub-model represents a portion of the consolidated configuration model.

14. A computer system to implement procedure for responding to one or more configuration queries using configuration sub-models, the system comprising:
    a processor; and
    a storage medium having data encoded therein, the data comprising processor executable code for:
        receiving one or more configuration queries from one or more computer systems;
        dividing one or more configuration queries into multiple configuration sub-queries, wherein the one or more configuration queries represent one or more questions involving parts and part relationships in a configuration of a configurable product, the multiple configuration sub-queries represent the one or more configuration queries, and the parts represent a composition of matter of the configurable product;
        processing each sub-query using at least one configuration sub-model per sub-query, wherein the configuration sub-models collectively model a configurable product;
        generating a response to the one or more configuration queries based upon the processing of each sub-query using at least one configuration sub-model per sub-query; and
        providing the response to the one or more configuration queries as data for display by a display device.

15. The computer system of claim 14 wherein each configuration sub-model includes data to define compatibility relationships between parts included in the configuration sub-model and each configuration sub-model
  (i) represents a portion of a configuration model of the configurable product and
  (ii) allows answers from each configuration sub-model to be combined to provide a consolidated answer to the one or more configuration queries.

16. The computer system of claim 14 wherein the one or more configuration queries relate to a configuration completion problem.

17. The computer system of claim 14 wherein the code is further executable by the processor for:
  processing each sub-query using multiple configuration sub-models per sub-query.

18. The computer system of claim 14 wherein the one or more configuration queries relate to a configuration validation problem and the code is further executable by the processor for:
  processing at least one of the sub-queries using different configuration sub-models until a configuration validation answer can be determined.

19. The computer system of claim 14 wherein the data collectively included in the configuration sub-models provides a response for each of the sub-queries being processed.

20. The computer system of claim 14 wherein at least two sub-queries include overlapping information.

21. The computer system of claim 14 wherein the code is further executable by the processor for:
  dividing a consolidated configuration model into the multiple configuration sub-models in accordance with a predetermined data structure;
  wherein at least one of the configuration queries into multiple configuration sub-queries further comprises dividing the sub-queries in accordance with the sub-model structure.

22. The computer system of claim 21 wherein the predetermined data structure comprises a data structure divided along configuration model part groups, wherein the part groups are a collection of related parts.

23. The computer system of claim 14 wherein the code is further executable by the processor for:
  generating a response for each processed configuration sub-model; and
  combining each response for each processed configuration sub-model to generate the answer.

24. The computer system of claim 14 wherein the code is further executable by the processor for:
  dividing a consolidated configuration model into the configuration sub-models.

25. The computer system of claim 24 wherein the code is further executable by the processor for:
  dividing the configuration model so that complexity of each configuration sub-model allows processing using available data processing capabilities of the computer assisted configuration technology while still representing the relationships included in the consolidated configuration model.

26. The computer system of claim 24 wherein each configuration sub-model represents a portion of the consolidated configuration model.

27. A tangible, non-transitory computer readable medium comprising code stored therein and executable for:
  receiving one or more configuration queries from one or more computer systems;
  dividing one or more configuration queries into multiple configuration sub-queries, wherein the one or more configuration queries represent one or more questions involving parts and part relationships in a configuration of a configurable product, the multiple configuration sub-queries represent the one or more configuration queries, and the parts represent a composition of matter of the configurable product;
  processing each sub-query using at least one configuration sub-model per sub-query, wherein the configuration sub-models collectively model a configurable product;
  generating a response to the one or more configuration queries based upon the processing of each sub-query using at least one configuration sub-model per sub-query; and
  providing the response to the one or more configuration queries as data for display by a display device.

28. The computer readable medium of claim 27 wherein each configuration sub-model includes data to define compatibility relationships between parts included in the configuration sub-model and each configuration sub-model (i) represents a portion of a configuration model of the configurable product and (ii) allows answers from each configuration sub-model to be combined to provide a consolidated answer to the one or more configuration queries.

29. The computer readable medium of claim 27 wherein the one or more configuration queries relate to a configuration completion problem.

30. The computer readable medium of claim 27 wherein the code is further executable by the processor for:
  processing each sub-query using multiple configuration sub-models per sub-query.

31. The computer readable medium of claim 27 wherein the one or more configuration queries relate to a configuration validation problem and the code is further executable by the processor for:
  processing at least one of the sub-queries using different configuration sub-models until a configuration validation answer can be determined.

32. The computer readable medium of claim 27 wherein the data collectively included in the configuration sub-models provides a response for each of the sub-queries being processed.

33. The computer readable medium of claim 27 wherein at least two sub-queries include overlapping information.

34. The computer readable medium of claim 27 wherein the code is further executable by the processor for:
  dividing a consolidated configuration model into the multiple configuration sub-models in accordance with a predetermined data structure;
  wherein at least one of the configuration queries into multiple configuration sub-queries further comprises dividing the sub-queries in accordance with the sub-model structure.

35. The computer readable medium of claim 34 wherein the predetermined data structure comprises a data structure divided along configuration model part groups, wherein the part groups are a collection of related parts.

36. The computer readable medium of claim 27 wherein the code is further executable by the processor for:
  generating a response for each processed configuration sub-model; and
  combining each response for each processed configuration sub-model to generate the answer.

37. The computer readable medium of claim 27 wherein the code is further executable by the processor for:

dividing a consolidated configuration model into the configuration sub-models.

38. The computer readable medium of claim 37 wherein the code is further executable by the processor for:

dividing the configuration model so that complexity of each configuration sub-model allows processing using available data processing capabilities of the computer assisted configuration technology while still representing the relationships included in the consolidated configuration model.

39. The computer readable medium of claim 37 wherein each configuration sub-model represents a portion of the consolidated configuration model.

* * * * *